United States Patent
Chen et al.

(10) Patent No.: US 6,982,209 B2
(45) Date of Patent: Jan. 3, 2006

(54) METHOD OF TRANSFERRING DEVICES BY LATERAL ETCHING OF A SACRIFICIAL LAYER

(75) Inventors: Yu-Cheng Chen, Hsinchu (TW);
Wen-Tung Wang, Hsinchu (TW);
Jung-Fang Chang, Hsinchu (TW);
Ching-Hsuan Tang, Hsinchu (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 64 days.

(21) Appl. No.: 10/704,795

(22) Filed: Nov. 12, 2003

(65) Prior Publication Data

US 2005/0032329 A1 Feb. 10, 2005

(30) Foreign Application Priority Data

Aug. 7, 2003 (TW) .............................. 92121727 A

(51) Int. Cl.
*H01L 21/465* (2006.01)
(52) U.S. Cl. ...................... 438/458; 438/149; 438/739

(58) Field of Classification Search ................ 438/149, 438/455, 458, 739, 977
See application file for complete search history.

(56) References Cited

U.S. PATENT DOCUMENTS

| | | | |
|---|---|---|---|
| 6,339,010 B2 * | 1/2002 | Sameshima ................. | 438/458 |
| 2003/0157783 A1 * | 8/2003 | Fonash et al. .............. | 438/458 |
| 2003/0170965 A1 * | 9/2003 | Kondo ........................ | 438/455 |
| 2004/0048447 A1 * | 3/2004 | Kondo ........................ | 438/458 |
| 2004/0102020 A1 * | 5/2004 | Roberds et al. ............. | 438/455 |

* cited by examiner

*Primary Examiner*—Stephen W. Smoot
(74) *Attorney, Agent, or Firm*—Bacon & Thomas, PLLC

(57) ABSTRACT

The present invention relates to a method for transferring devices. A sacrificing layer is positioned before the devices are manufactured, and a transition substrate is pasted on the devices. Then, a method for lateral wet etching or a method for lateral wet etching with mechanical stripping is applied for removing or stripping the sacrificing layer so as to separate the devices and a substrate. The separated devices are transferred to the transition substrate so as to meet the requirements for various products and applications.

15 Claims, 8 Drawing Sheets

METHOD OF TRANSFERRING DEVICES BY LATERAL ETCHING OF A SACRIFICIAL LAYER

BACKGROUND OF THE INVENTION

1. Field of the Invention

The present invention relates to a method for transferring devices. More particularly, this invention can be applied in transferring the devices to a flexible substrate.

2. Description of the Prior Art

As the flat panel display is developed toward large area, the characteristics of lightness, thinness, and flexibility are another trends. The main trend of the development is to use a plastic substrate in place of a glass substrate. Nowadays, the flat panel display is produced on the glass panel for the advantages of great area and mass production, but the substrate has been changed into the plastic substrate when the advantages of lightness, thinness and flexibility are required. However, the process temperature of the thin film transistor liquid crystal display (TFT-LCD) fabrication is 300~400° C., so the plastic substrate is not applicable to TFT-LCD fabrication. Thus, many alternative methods are developed, particularly, the method of reducing the process temperature and transferring devices. However, the method for reducing the process temperature will affect the characteristic of the device and cause the problems of bad adhesion, lithography over-focus, stress, static electricity and so on. Therefore, the method of transferring devices is more feasible.

Please refer to FIGS. 1A–1F. FIGS. 1A–1F are perspective diagrams showing steps of a prior art transfer technology disclosed in U.S. Pat. No. 6,127,199. In FIG. 1A, a light absorption layer 12 is formed on the substrate 10. In FIG. 1B, a device layer 14 is formed on the light absorption layer 12. The detailed description for the device 15 in the device layer 14 will not be described because it is not crucial in this technology. Please refer to FIG. 1C, an adhesive layer 16 is used to pasting the transferred substrate 18 to the device layer 14. As shown in FIG. 1D, The laser light is irradiated through the substrate and the light absorption layer so as to separate the substrate from the light absorption layer. Please refer to FIG. 1E. Practically, the light absorption layer 12 may be removed together with the substrate 10. If not, the methods of washing, etching and polishing can be used for removing the light absorption layer 12, as FIG. 1F shown. This is a well-known prior art. However, the drawback is to precisely control the energy of the laser light for preventing the thin-film LCD device from damage.

Please refer to FIGS. 2A–2F. FIGS. 2A–2F are perspective diagrams showing steps of a prior art transfer technology of devices disclosed in U.S. Pat. No. 6,232,136. As shown in FIG. 2A, an upper and a lower oxidization layers 34, 32 are positioned on the substrate 30. Besides, an isolation layer 36 is positioned on the upper oxidization layer 34. Then, a thin film 38 is positioned on the isolation layer 36, and the devices 40 are formed on the thin film 38. FIG. 2B shows the step for opening a hole 42 on the isolation layer 36 and the upper oxidization layer 34. Then, as shown in FIG. 2C, the resin 48 is filled in the opening hole 42, after the filling, via holes 46 are formed on the isolation layer 36. Please refer to FIG. 2D. With the support of the resin 48, the upper oxidization layer 34 is removed by lateral etching process so as to form the structure with a blank layer 50. Thereafter, with the support of the resin 48, the reserved resin 82 and the removed resin 84 are form. Please refer to FIG. 2E. A transition substrate 80 is further positioned on the reserved resin 82 and the removed resin 84. Finally, please refer to FIG. 2F. The removed resin 84 connected to the resin 48 is removed together with a part of the isolation layer 36 so as to complete the process of the transfer.

The above is the detailed description of the two prior art technologies. However, in order to achieve the object of transferring the devices, the precise controlling for the energy is required and the complicated process has to be handled. Therefore, the practical application is faulty and other technology has to be further developed and applied so as to accomplish the devices transfer.

SUMMARY OF THE INVENTION

The present invention relates to a method for transferring devices. The devices are produced on a substrate, and a buffer layer and a metal sacrificial layer are positioned between the substrate and the device. Then, a lateral etching method is used to remove the metal sacrificial layer so as to achieve the object of separation and transferring the devices.

When transferring the devices, a plurality of etching channels between the devices is formed in the buffer layer by photolithography and etching, wherein the etching channels expose some parts of the sacrificial layer, and then the metal sacrificial layer is etched partially by a first step lateral etching process. Next, a first transition substrate is pasted on the device. Thereafter, by applying a second step lateral etching or the mechanical stripping process, the remaining metal sacrificial layer is removed or stripped so that the devices are separated from the substrate. Thus, the transfer of the devices is finished.

Alternatively, a pre-patterned metal sacrificial layer is formed on the substrate, and thereafter a buffer layer is deposited on the metal sacrificial layer. With this pre-patterned design, parts of the buffer layer are connected to the substrate to be pillars of the devices, and then the devices are formed on the buffer layer. In the transfer process, a plurality of etching channels between the devices is formed in the buffer layer by photolithography and etching, wherein the etching channels expose some parts of the sacrificial layer. Thereafter, the metal sacrificial layer is removed fully by first lateral etching through the etching channels, and then a first transition substrate is pasted on the devices. Finally, the pillars of the sacrificial layer are removed by a second lateral etching process or stripped by a mechanical stripping process, and therefore the substrate is separated from the devices and the transfer of the devices is accomplished.

In the two methods mentioned above, after the devices transfer is accomplished, the devices can further be transferred to a second transition substrate. Namely, the second transition substrate is adhesive to the other side of the device so as to promote the usability of the design of transfer.

With the present invention employed, the device can be easily manufactured and there is no need to change the parameters of the manufacture, and then the devices can be transferred to any substrate desired. The devices with high performance fabricated in high temperature also can be produced by using this invention. Besides, the substrate applied can be recycled and repeatedly used so as to reduce the cost.

BRIEF DESCRIPTION OF THE DRAWINGS

The accompanying drawings, which are incorporated in and form part of the specification in which like numerals designate like parts, illustrate preferred embodiments of the present invention and together with the description, serve to explain the principles of the invention. In the drawings.

DETAILED DESCRIPTION OF THE PREFERRED EMBODIMENT

The present invention provides a method of transferring devices. By applying the present manufacturing process, after forming the display devices on a substrate, the display devices are transferred on another substrate made of a desired material by the present invention. Therefore, without changing the conditions of the original manufacturing process for the devices, the devices fabricated can be transferred to any desired substrate.

Embodiment 1

Figure 1A:
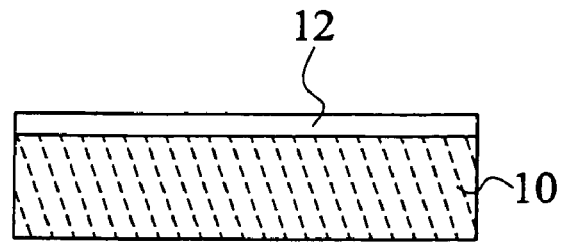
FIGS. 1A–1F are perspective diagrams showing steps of a prior art transfer technology.
Figure 1B:
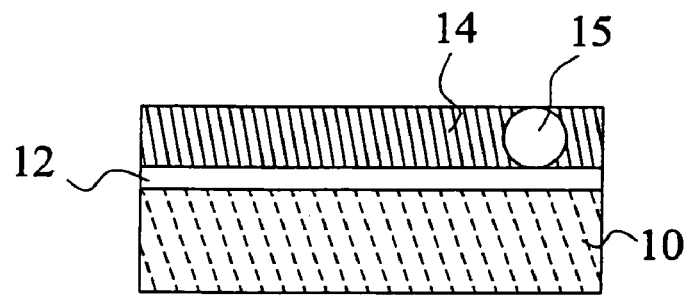
Figure 1C:
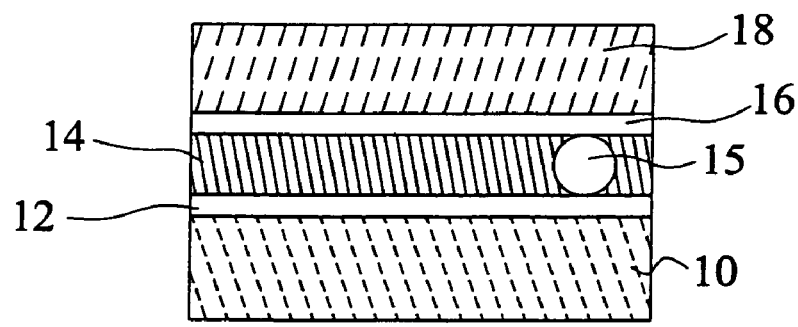
Figure 1D:
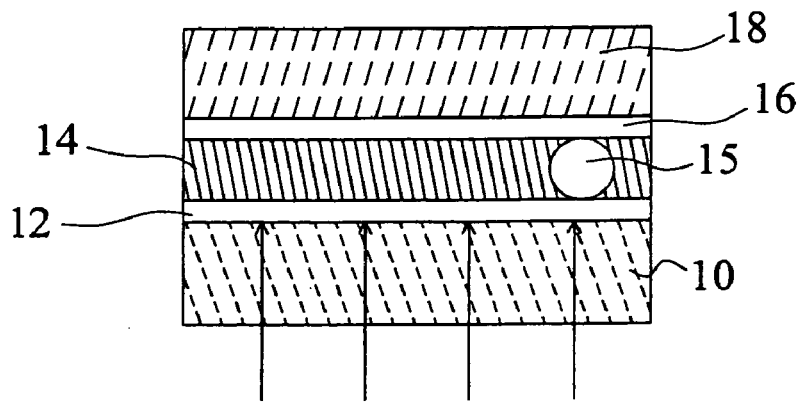
Figure 1E:
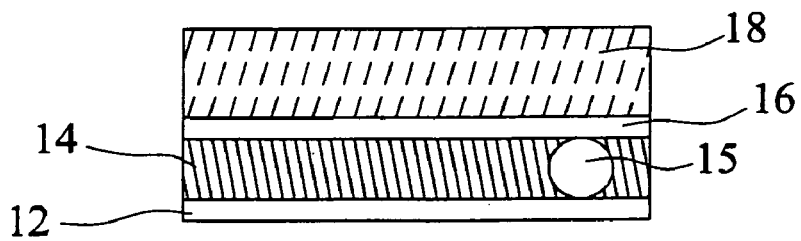
Figure 1F:
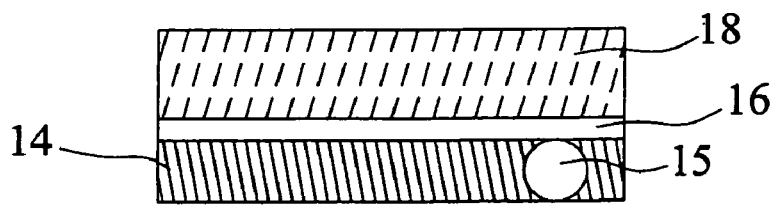
Figure 2A:
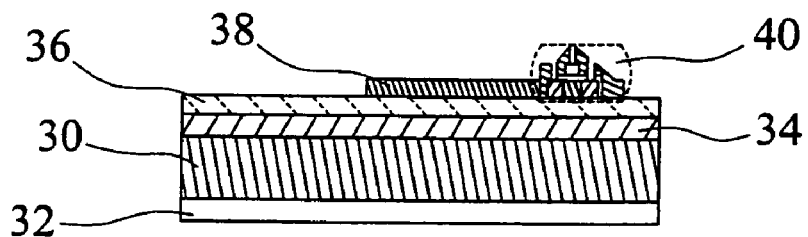
FIGS. 2A–2F are perspective diagrams showing steps of a prior art transfer technology of devices.
Figure 2B:
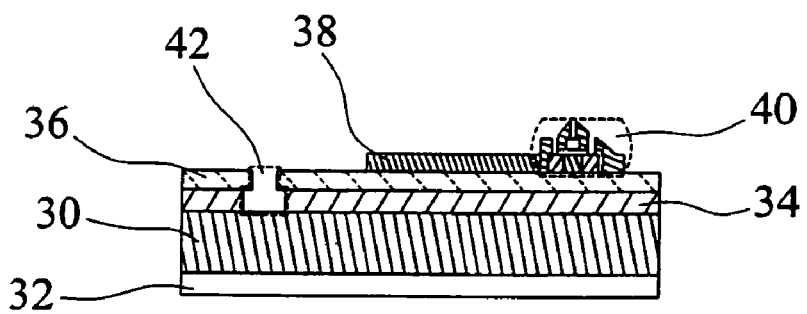
Figure 2C:
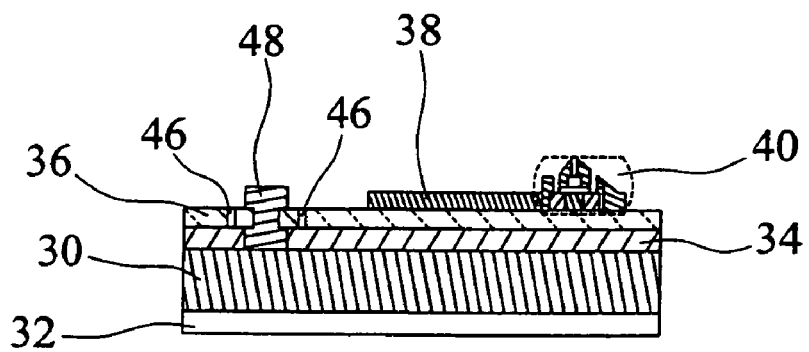
Figure 2D:
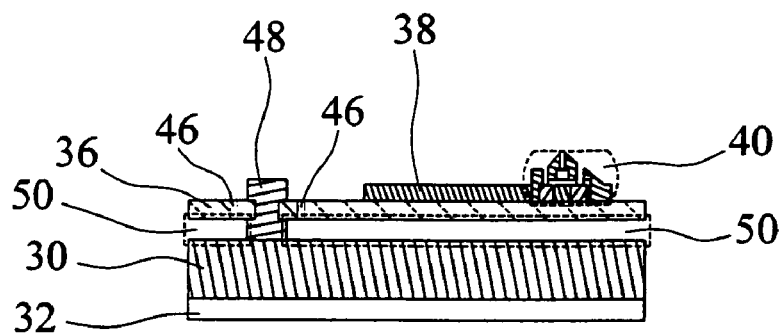
Figure 2E:
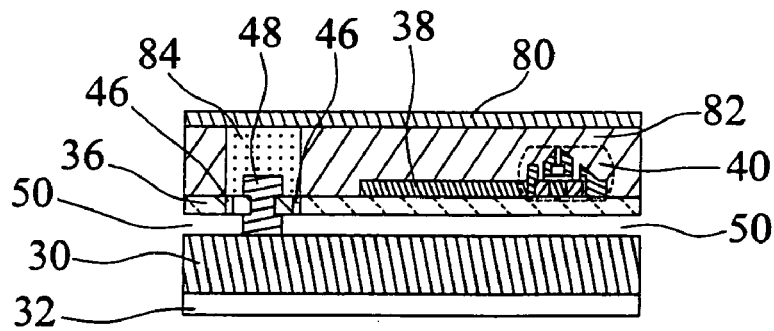
Figure 2F:
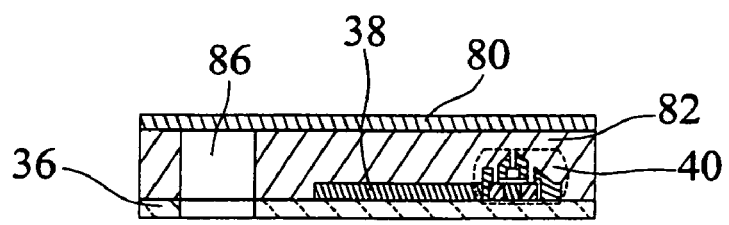
Figure 3A:
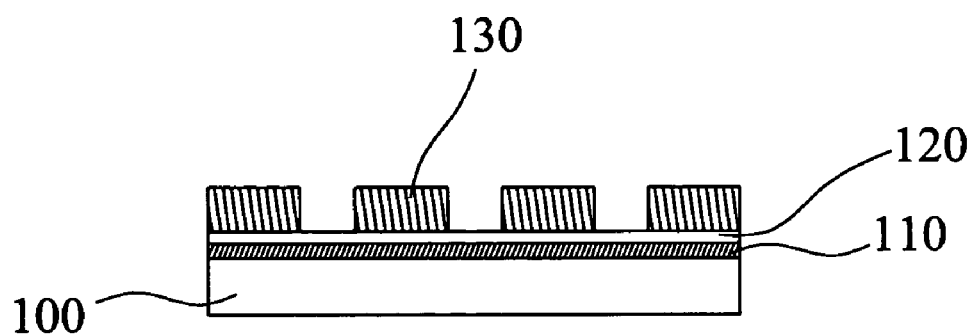
FIGS. 3A–3G are perspective diagrams showing steps of a manufacturing process according to a first embodiment of the present invention.

Please refer to FIGS. 3A–3G are the perspective diagrams showing steps of a manufacturing process according to a first embodiment of the present invention. At the beginning, as shown in FIG. 3A, a sacrificial layer 110 made of metal material is formed on a substrate 100, and then a buffer layer 120 made of silicon oxide or silicon nitride is formed on the sacrificial layer 110, and the required devices 130 is produced and formed on the buffer layer 120. Thereafter, the transferring of the devices 130 will be performed.

Figure 3B:
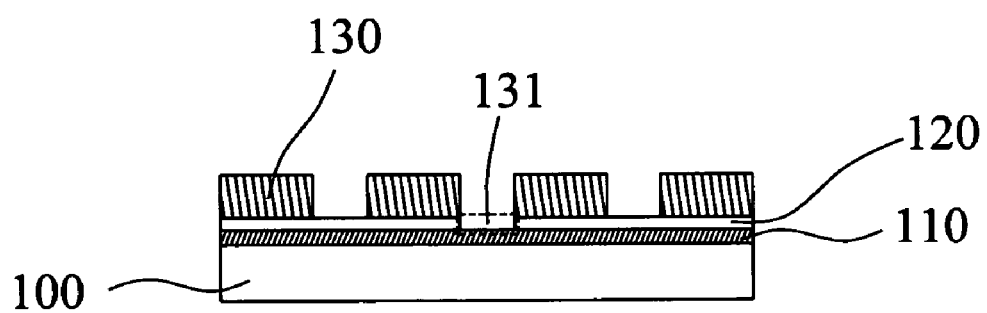
Figure 3C:
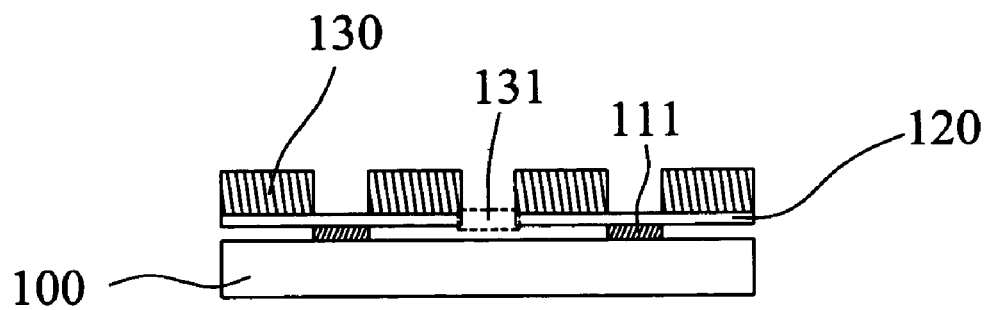

Please refer to FIG. 3B. Between the devices 130, an etching channel 131 is formed in the buffer layer 120 by photolithography and etching. The object is the sacrificial layer 110 can be etched laterally by an etching solution for the sacrificial layer 110 passing through the etching channel 131. Please refer to FIG. 3C; FIG. 3C shows that the position of the etching channel 131 is so designed that the extent of the etching for the sacrificial layer can be properly controlled. The sacrificial layer 110 is thus removed partially so as to form sacrificial layer pillars 111. With the sacrificial layer pillars 111, the devices 130 can be supported on the substrate 100.

Figure 3D:
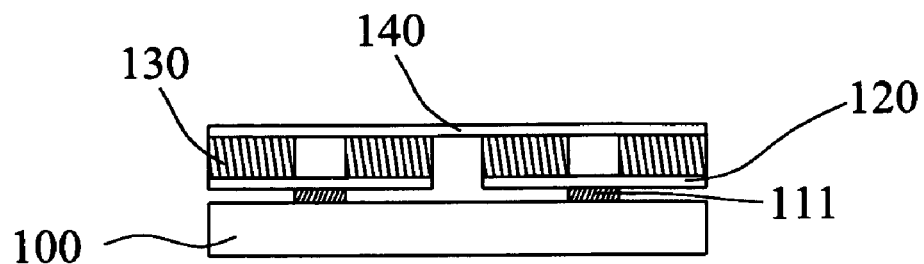

Please refer to FIG. 3D. After the etching of the sacrificial layer 110 is finished and the sacrificial layer pillars 111 are remained, a first transition substrate 140 is pasted on the devices 130. The first transition substrate 140 can be made of a material with flexibility or a material suitable for other designs.

Figure 3E:
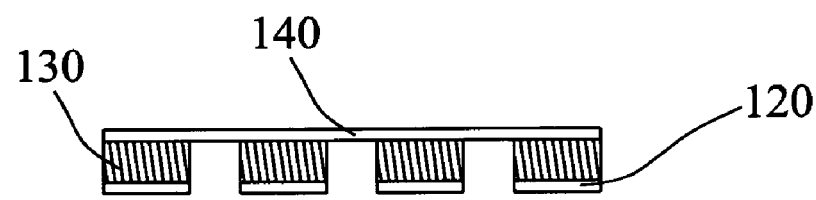
Figure 3F:
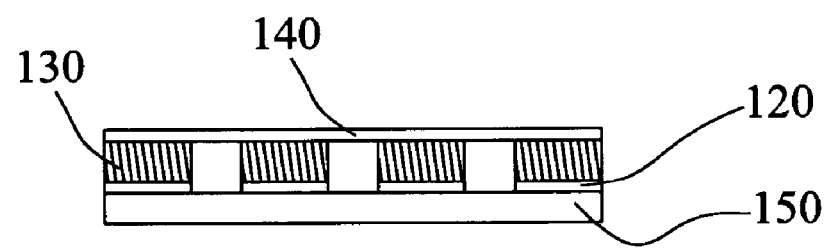
Figure 3G:
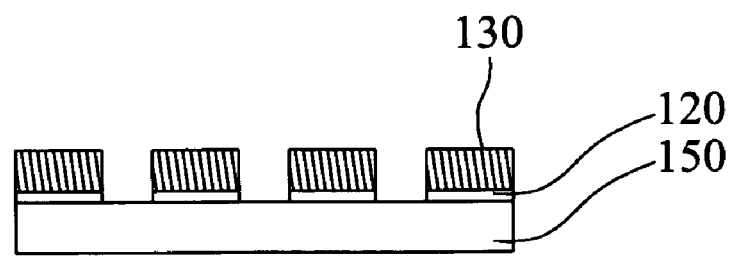

As shown in FIG. 3E, after the first transition substrate 140 is pasted on the devices 130, the substrate 100 is separated from the sacrificial layer pillars 111. The method for separating can be mechanical stripping or a lateral etching for the sacrificial layer pillars 111, wherein the lateral etching for the sacrificial layer pillars 111 is performed in the etching solution for the sacrificial layer 110. Therefore, the first transfer of the devices 130 is accomplished.

Thereafter, according to the requirements of the practical applications, a second transfer process can be further performed. Please refer to FIG. 3F, after finishing the first transfer of the devices 130, on the other side of the devices 130, a second transition substrate 150 is pasted on the buffer layer 120. Please refer to FIG. 3G, the first transition substrate 140 is removed, and the second transfer of the devices 130 is finished.

Embodiment 2

Figure 4A:
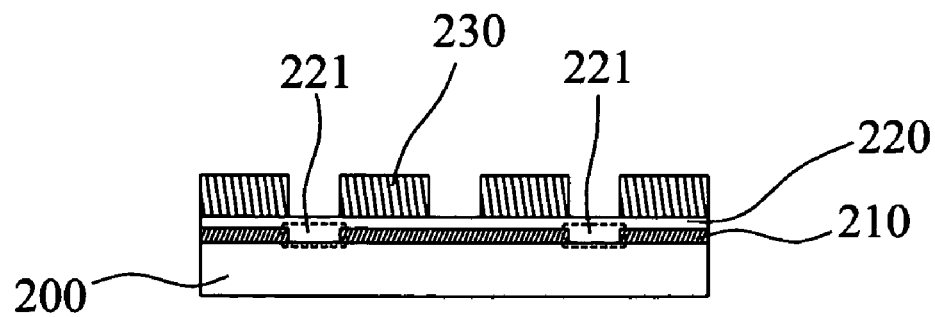
FIGS. 4A–4G are perspective diagrams showing steps of a manufacturing process according to a second embodiment of the present invention.

Because the extent of the lateral etching employed for the first embodiment is difficult to control well, so another method for transferring devices is provided. Please refer to FIGS. 4A~4G. FIGS. 4A~4G are the perspective diagrams showing steps of a manufacturing process according to a second embodiment of the present invention. FIG. 4A is similar to FIG. 3A. However, there are some differences between the sacrificial layer 210 and the buffer layer 220. When positioning the sacrificial layer 210, the sacrificial layer 210 is formed at a proper position designed, and a plurality of holes is remained. Thereafter, the buffer layer 220 is also formed on the sacrificial layer 210 and fills the holes in the sacrificial layer 210 to form buffer layer pillars 221. In addition, and then the devices 230 is formed on the buffer layer 220.

Figure 4B:
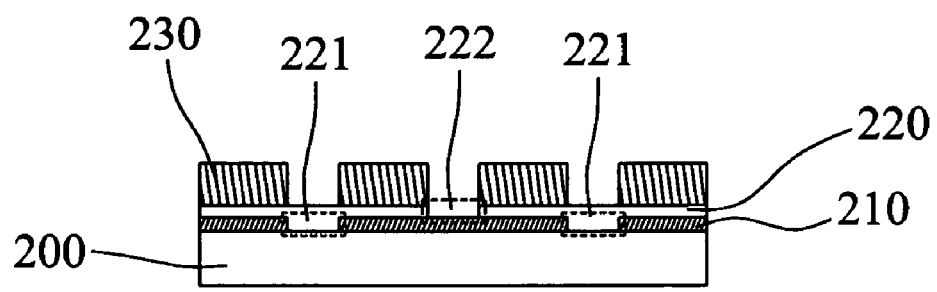
Figure 4C:
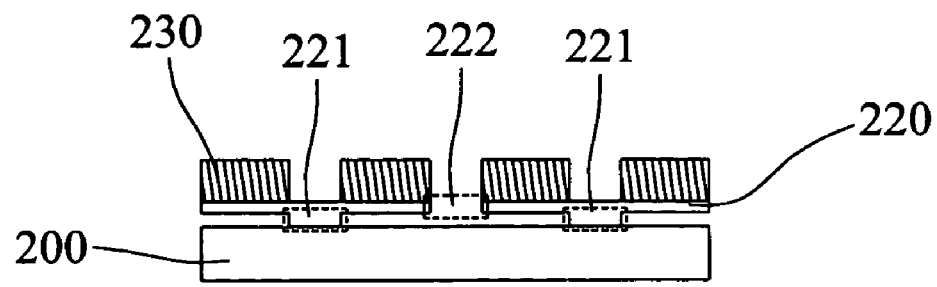

Then, please refer to FIG. 4B. Similar to the first embodiment, between the devices 230, an etching channel 222 is formed in the buffer layer 220 by photolithography and etching. Thereafter, the lateral etching for the sacrificing layer 210 is performed. Please refer to FIG. 4C. The object of positioning the etching channel 222 is that the sacrificial layer 210 can be etched laterally by an etching solution for the sacrificial layer 210 passing through the etching channel 222; therefore, the sacrificial layer 210 is removed fully, and then only the buffer layer pillars 221 are remained to connect the substrate 200 and to support the devices 230.

Figure 4D:
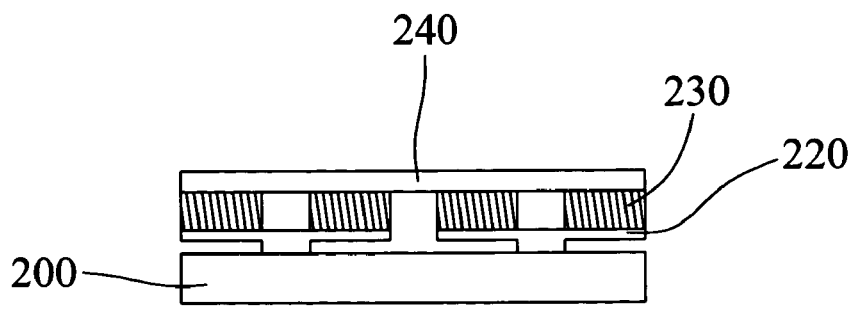
Figure 4E:
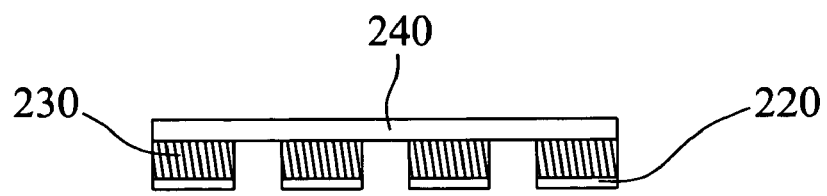
Figure 4F:
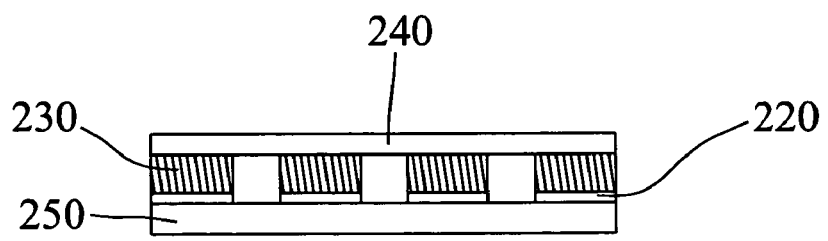
Figure 4G:
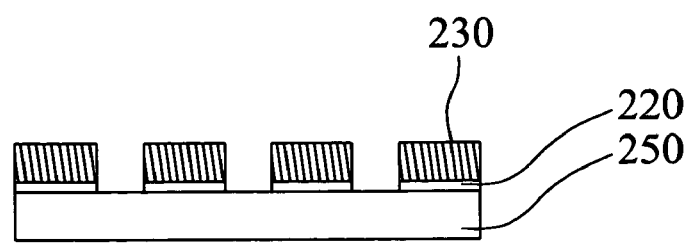

Please refer to FIG. 4D. After the etching for the sacrificial layer 210 is finished, a first transition substrate 240 is pasted on the devices 230. Then, please refer to FIG. 4E; after the first transition substrate 240 is pasted, the substrate 200 is separated from the buffer layer pillars 221. The method for separating can be mechanical stripping or a lateral etching for the buffer layer pillars 221, wherein the lateral etching for the buffer layer pillars 221 is performed in the etching solution for the buffer layer 220. Thus, the first transfer of the devices 230 is finished.

Thereafter, according to the requirements of the practical applications, a second transfer process can be further performed. Please refer to FIG. 4F, after finishing the first transfer of the devices 230, on the other side of the devices 230, a second transition substrate 250 is pasted on the buffer layer 220. Please refer to FIG. 4G, the first transition substrate 240 is removed, and the second transfer of the devices 230 is finished.

The above is the detailed description of the present invention. Practically, in the manufacturing process, there is no limitation for the material and the usage of the buffer layer, the sacrificing layer and the transition substrate.

While the present invention has been disclosed with reference to the preferred embodiments of the present invention, it should not be considered as limited thereby. Various possible modifications and alterations by one skilled in the art can be included within the spirit and scope of the present invention; the scope of the invention is determined by the claims that follow.

What is claimed is:

1. A method of transferring devices, comprising steps of:
   (a) forming a sacrificial layer on a substrate, wherein the sacrificial layer is made of metal;
   (b) forming a buffer layer on the sacrificial layer;
   (c) forming devices on the buffer layer;

(d) forming a plurality of etching channels in the buffer layer and between the devices, and the etching channels expose a portion of the sacrificial layer;

(e) utilizing the etching channels to remove parts of the sacrificial layer by lateral etching, and a plurality of pillars of the sacrificial layer is remained;

(f) pasting a first transition substrate on the devices; and (g) separating the substrate from the buffer layer by removing or stripping off the pillars of the sacrificial layer, the devices are transferred.

2. The method of claim 1, wherein the buffer layer is made of silicon oxide or silicon nitride.

3. The method claim 1, wherein in the step (e) is processed by passing an etching solution for the sacrificial layer through the etching channels.

4. The method of claim 1, wherein in the step (g) further comprises:

removing the pillars of the sacrificial layer by lateral wet etching.

5. The method of claim 1, wherein in the step (g) further comprises:

stripping off the pillars of the sacrificial layer by mechanical stripping.

6. The method of claim 1, wherein after the step (g) further comprises:

pasting a second transition substrate on the buffer layer; and removing the first transition substrate.

7. A method of transferring devices, comprising:

(a) forming a sacrificial layer on a substrate, and the sacrificial layer has a plurality of holes exposing parts of the substrate;

(b) forming a buffer layer to cover the sacrificial layer and fill the plurality of holes to form a plurality of pillars;

(c) forming the devices on the buffer layer;

(d) forming a plurality of etching channels in the buffer layer and between the devices, and the etching channels expose a portion of the sacrificial layer;

(e) utilizing the etching channels to remove the sacrificial layer fully by lateral etching, and the pillars of the buffer layer is remained;

(f) pasting a first transition substrate on the devices; and (g) separating the substrate from the buffer layer by removing or stripping off the pillars of the buffer layer, the devices are transferred.

8. The method of claim 7, wherein the sacrificial layer is made of metal.

9. The method of claim 7, wherein the buffer layer is made of silicon oxide or silicon nitride.

10. The method of claim 7, wherein the plurality of pillars is used to support the devices.

11. The method of claim 7, wherein the etching channels are positioned on the sacrificial layer.

12. The method of claim 7, wherein the step (e) is processed by passing an etching solution for the sacrificial layer through the etching channels.

13. The method of claim 7, wherein in the step (g) further comprises:

removing the pillars of the buffer layer by lateral wet etching.

14. The method of claim 7, wherein in the step (g) further comprises:

stripping off the pillars of the buffer layer by mechanical stripping.

15. The method of claim 7, wherein after the step (g) further comprises:

pasting a second transition substrate on the buffer layer; and removing the first transition substrate.

* * * * *